US012010483B2

(12) United States Patent
Nighman et al.

(10) Patent No.: US 12,010,483 B2
(45) Date of Patent: Jun. 11, 2024

(54) ACOUSTIC MICROPHONE ARRAYS

(71) Applicant: QSC, LLC, Costa Mesa, CA (US)

(72) Inventors: Christopher Charles Nighman, Broomfield, CO (US); Gerrit Eimbertus Rosenboom, Longmont, CO (US); Mauricio Greene, Piedmont, CA (US); Alfredo Martin Aguilar, Chula Vista, CA (US)

(73) Assignee: QSC, LLC, Costa Mesa, CA (US)

( * ) Notice: Subject to any disclaimer, the term of this patent is extended or adjusted under 35 U.S.C. 154(b) by 184 days.

(21) Appl. No.: 17/396,495

(22) Filed: Aug. 6, 2021

(65) Prior Publication Data

US 2023/0047408 A1    Feb. 16, 2023

(51) Int. Cl.
| | | |
|---|---|---|
| *H04R 1/40* | (2006.01) | |
| *G06F 30/20* | (2020.01) | |
| *H04R 1/04* | (2006.01) | |
| *H04R 3/00* | (2006.01) | |
| *H04R 19/01* | (2006.01) | |

(52) U.S. Cl.
CPC ............ *H04R 1/406* (2013.01); *G06F 30/20* (2020.01); *H04R 1/04* (2013.01); *H04R 3/005* (2013.01); *H04R 19/01* (2013.01); *H04R 19/016* (2013.01); *H04R 2201/003* (2013.01)

(58) Field of Classification Search
CPC .......... H04R 3/005; H04R 1/04; H04R 19/01; H04R 19/016; H04R 2201/003; H04R 1/406; H04R 25/027; G06F 30/20
See application file for complete search history.

(56) References Cited

U.S. PATENT DOCUMENTS

| | | | |
|---|---|---|---|
| 9,565,493 B2 | 2/2017 | Abraham et al. | |
| 9,980,075 B1* | 5/2018 | Benattar | ............... H04S 7/303 |
| 10,873,814 B2 | 12/2020 | Vilkamo et al. | |
| 2004/0175006 A1 | 9/2004 | Kim et al. | |
| 2005/0225497 A1* | 10/2005 | Christensen | ............. H01Q 3/26 |
| | | | 343/893 |
| 2009/0226004 A1 | 9/2009 | Sørensen | |
| 2010/0272286 A1* | 10/2010 | Bai | ...................... G01H 3/125 |
| | | | 381/92 |
| 2015/0078582 A1 | 3/2015 | Graham et al. | |

(Continued)

FOREIGN PATENT DOCUMENTS

| | | | |
|---|---|---|---|
| CN | 101413824 A | * | 4/2009 |
| WO | WO2016/178707 | | 11/2016 |

OTHER PUBLICATIONS

Chan et al., "Uniform Concentric Circular Arrays With Frequency-Invariant Characteristics—Theory, Design, Adaptive Beamforming and DOA Estimation", IEEE Transactions on Signal Processing, vol. 55, No. 1, dated Jan. 2007.

(Continued)

*Primary Examiner* — Carolyn R Edwards
*Assistant Examiner* — Kuassi A Ganmavo
(74) *Attorney, Agent, or Firm* — Haynes and Boone, LLP

(57) ABSTRACT

Acoustic microphone array systems including arrays of microphones placed on a printed circuit board or other substrate in asymmetric patterns. A plurality of additional non-microphone components also reside on the board. The asymmetric placement of the microphones in the array provides flexibility in physically accommodating the additional non-microphone components.

19 Claims, 9 Drawing Sheets

(56) References Cited

U.S. PATENT DOCUMENTS

| | | | | |
|---|---|---|---|---|
| 2016/0323668 | A1* | 11/2016 | Abraham | H04R 1/406 |
| 2016/0330545 | A1* | 11/2016 | McElveen | H04R 1/406 |
| 2017/0026728 | A1* | 1/2017 | Elko | H04R 3/005 |
| 2017/0308352 | A1* | 10/2017 | Kessler | H04R 3/005 |
| 2019/0132672 | A1* | 5/2019 | Dick | H04R 3/005 |
| 2019/0394338 | A1* | 12/2019 | Wada | H04M 9/082 |
| 2020/0100025 | A1 | 3/2020 | Shumard et al. | |
| 2020/0413187 | A1* | 12/2020 | Liao | H04R 3/005 |
| 2021/0067870 | A1* | 3/2021 | Berge | H04S 3/002 |
| 2021/0250684 | A1* | 8/2021 | Sonogi | H04R 3/005 |
| 2022/0353608 | A1* | 11/2022 | Athineos | H04R 1/04 |

OTHER PUBLICATIONS

Chou, "Frequency-Independent Beamformer with Low Response Error", The Institute of Electrical and Electronics Engineers, vol. 5, dated 1995.

Firoozabadi et al., "Combination of Nested Microphone Array and Subband Processing for Multiple Simultaneous Speaker Localization", $6^{th}$ International Symposium on Telecommunications (IST), dated 2012.

Lai, "A Study into the Design of Steerable Microphones Arrays", Department of Electrical and Computer Engineering, dated Dec. 2012.

Roig et al., "Towards an enhanced performance of uniform circular arrays at low frequencies", Proceedings of INTER-NOISE, dated Sep. 2013.

Tiete et al., "SoundCompass: A Distributed MEMS Microphone Array-Based Sensor for Sound Source Localization", Sensors, vol. 14, No. 2, dated 2014.

International Search Report and Written Opinion of PCT Application No. PCT/US2022/074485, dated Dec. 8, 2022, in 13 pages.

\* cited by examiner

ACOUSTIC MICROPHONE ARRAYS

BACKGROUND

The present disclosure relates generally to acoustic microphone systems incorporating an array of microphone elements.

SUMMARY

According to aspects of the disclosure, an acoustic microphone array system includes a substrate and an array of acoustic microphones. The array have a first group of acoustic microphones placed on the substrate in an asymmetric pattern and a second group of microphones. The radial distance of each microphone in the first group of microphones may be larger than the radial distance of each microphone in the second group of microphones. The substrate can be circular, or have a variety of other shapes, depending on the embodiment.

The second group of microphones can be placed on the substrate in an asymmetric pattern in some embodiments. In some implementations, the radial distance of an innermost microphone in the second group of microphones is no more than about 25% of a radial distance of an outermost microphone in the first group of microphones.

In some embodiments, the system further includes one or more packaged integrated circuits placed on the substrate at a radial distance greater than the radial distance of the innermost microphone in the second group and less than the radial distance of the outermost microphone in the first group. In further embodiments, the radial distance of an innermost microphone in the first group of microphones is no more than 50% of the radial distance of an outermost microphone in the first group of microphones. The packaged integrated circuits can be placed on the substrate at a radial distance between the radial distance of the innermost microphone in the first group of microphones and the radial distance of the outermost microphone in the first group of microphones.

The first group of microphones in some embodiments includes N microphones, and the maximum difference in polar angle between any two angularly adjacent microphones of the first group of microphones is at least 130% of 360/N. The system can further include a packaged integrated circuit placed between angularly adjacent microphones in the first group of microphones.

In some embodiments, the system includes a group of packaged integrated circuits mounted on the substrate together with the first and second groups of microphones. The group of packaged integrated circuits can include one or more networking devices and one or more microprocessors.

The system can further include a processor placed on the substrate and configured to perform one or both of acoustic echo cancelation and beamforming on signals output by the first and second groups of microphones.

The system can further include a processor configured to combine signals output by the first group of acoustic microphones to generate output sound within a first frequency range and to combine signals output by the second group of acoustic microphones to generate output sound within a second frequency range. The first and second frequency can, in some embodiments, cover a combined frequency that at least includes frequencies from 1,000 Hz to 14,000 Hz. A maximum frequency in the first frequency range can be substantially less than 14,000 Hz, and a minimum frequency of the second frequency range can be substantially more than 1,000 Hz.

According to some embodiments, the processor is remote from the first and second groups of microphones, and in communication with the first and second groups of microphones via a network.

According to further aspects of the disclosure, an audio system is provided that includes a substrate, an array of acoustic microphones, and a processor. The array can include a first group of acoustic microphones arranged on the substrate in an asymmetric pattern> The array may further include a second group of acoustic microphones arranged on the substrate in an asymmetric pattern. The radial distance of an innermost microphone of the first group of microphones from a center of the substrate may be greater than a radial distance of an outermost microphone of the second group of microphones and no more than about 40% of the radial distance of an outermost microphone of the first group of microphones. The radial distance of the outermost microphone in the second group of microphones may be no more than about 25% of the radial distance of the outermost microphone in the first group of microphones. The processor can be configured to combine signals output by the first group of acoustic microphones to generate output sound within a first frequency range and to combine signals output by the second group of acoustic microphones to generate output sound within a second frequency range. In some embodiments, the processor is remote from the first and second groups of microphones, and in communication with the first and second groups of microphones via a network.

According to yet further aspects of the disclosure, a method of generating a microphone layout for an array microphone is provided. The method can include placing each microphone in first and second groups of microphones in an arbitrary initial position on the substrate. Subsequent to said placing each microphone, the microphones can be arranged at an initial set of microphone positions.

The method can include, with a software simulator, determining array performance with the microphones at the initial set of microphone positions.

The method can also include, subsequent to said determining array performance, adjusting placement of one or more microphones in one or both of the first group of microphones and the second group of microphones such that the microphones are arranged at an adjusted set of microphone positions.

The method can additionally include, with the software simulator, determining adjusted array performance at the adjusted set of microphone positions. The method can further include repeating said adjusting placement and determining adjusted array performance said adjusted array performance indicates sufficient performance at a set of final microphone positions in which the first group of microphones is arranged in a first asymmetric pattern and the second group of microphones is arranged in a second asymmetric pattern.

The method can also include placing a plurality of non-microphone components on a substrate.

At the set of final microphone positions, each microphone in the first group may be located at a longer radial distance from the center of the substrate than each microphone in the second group.

The placing of the plurality of non-microphone components may be performed prior to said placing each microphone in the first and second groups of microphones in an initial position on the substrate.

DETAILED DESCRIPTION

Figure 1:
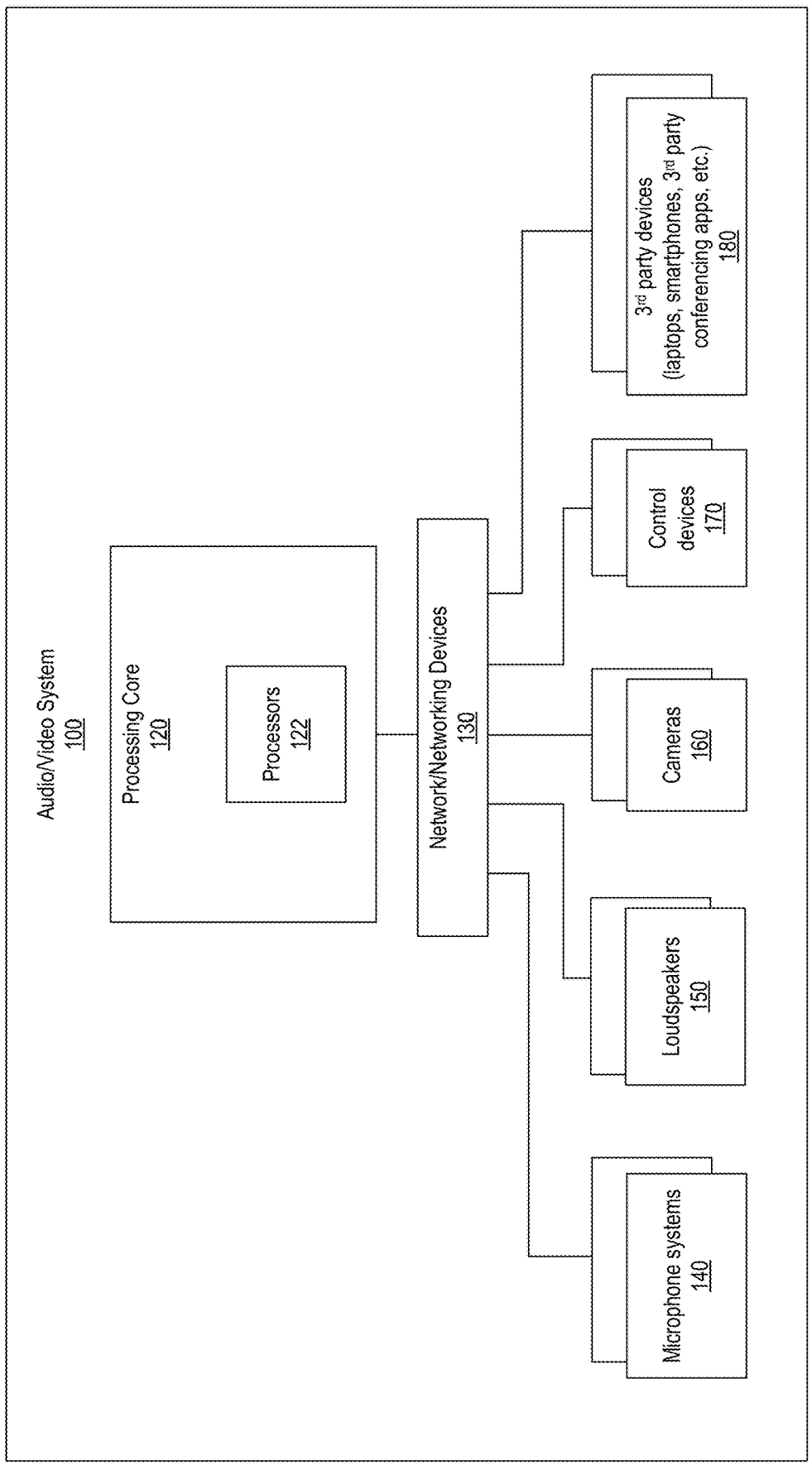
FIG. 1 illustrates an audio/video system incorporating one or more microphone systems according to certain embodiments.

For purposes of summarizing the disclosure, certain aspects, advantages and novel features of the disclosures have been described herein. It is to be understood that not necessarily all such advantages can be achieved in accordance with any particular embodiment of the disclosures disclosed herein. Thus, the disclosures disclosed herein can be embodied or carried out in a manner that achieves or optimizes one advantage or group of advantages as taught herein without necessarily achieving other advantages as can be taught or suggested herein.

System Overview

Audio processing systems include sophisticated computer-controlled equipment that receive and distribute sound in a space. Such equipment can be used in business establishments, bars, restaurants, conference rooms, concert halls, churches, or any other environment where it is desired to receive audio inputs from a source and deliver it to one or more speakers for people to hear. Some modern systems incorporate integrated audio, video, and control (AV&C) capability to provide an integrated system architecture. An example of such a system is the QSC® Q-SYS™ Ecosystem provided by QSC, LLC, which provides a scalable software-based platform. A simplified representation of an audio/video system 100 is shown and described with respect to FIG. 1.

The system 100 includes a processing core 120 that includes one or more processors 122, a network 130, one or more microphone systems 140, loudspeakers 150, cameras 160, control devices 170, and third party devices 180. The processor(s) 122 of the illustrated embodiment is a general purpose microprocessor, although alternative configurations can include an audio processor designed for audio digital signal processing.

The microphone systems 140 can include one or more array microphone systems, which can be any of the array microphone systems described herein including microphones mounted in an asymmetric array, although other types of microphone systems can also be included. The cameras 160 can include one or more digital video cameras. The control devices 170 can include any appropriate user input devices such as a touch screen, computer terminal or the like. While not shown in FIG. 1, the system 100 can also include appropriate supporting componentry, such as one or more audio amplifiers or equalization components.

The third party devices 180 can include one or more laptops, desktops or other computers, smartphones or other mobile devices, projectors, screens, lights, curtains/shades, fans, and third party applications that can execute on such devices, including third party conferencing applications such as Zoom or Microsoft® Teams or digital voice assistants like Apple's Siri®.

While illustrated as separate components in FIG. 1, depending on the implementation, microphone systems 140, loudspeakers 150, cameras 160, control devices 170, and/or third party devices 180 can be integrated together. For example, some or all of a microphone array, loudspeaker, camera, and touch screen can be integrated into a common packaging.

In operation, the microphone(s) 140 detect sounds in the environment, convert the sounds to digital audio signals, and stream the audio signals to the processing core 120 over the network 130. The processor(s) 122 receives the audio signals and performs digital signal processing on the signals. For example, the processor 122 can perform fixed or adaptive echo cancellation, fixed or adaptive beamforming to enhance signals from one or more directions while suppressing noise and interference from other directions, amplification, or any combination thereof. Other types of noise processing, spatial filtering, or other audio processing can be performed depending on the embodiment. In some embodiments, instead of the microphone 140 sending raw digital audio signals to the processing core 120, one or more processors on the microphone system 140 itself perform some or all of the echo cancellation, beamforming, amplification, or other processing prior to sending the signal to the processing core 120.

As mentioned, the microphone system 140 can include one or more microphone arrays including a plurality of individual microphone elements. As these microphone arrays become more feature-rich, they include increasing numbers of not only microphone elements but other components (processors, sensors, electrical components, etc.), as will be described in more detail including with respect to FIGS. 3A-3D and FIGS. 5 and 6. However, existing microphone arrays such as those used for beamforming typically employ microphones arranged in rigidly defined geometries. These can include concentric rings, straight lines, squares, rectangles, or the like. As the number and sophistication of microphone components continues to increase, it can be difficult to physically accommodate rigidly defined microphone geometries together with the other components. Certain embodiments described herein address these and other challenges by allowing flexible microphone arrangements, freeing up real estate on the microphone board.

Microphone System

Figure 2:
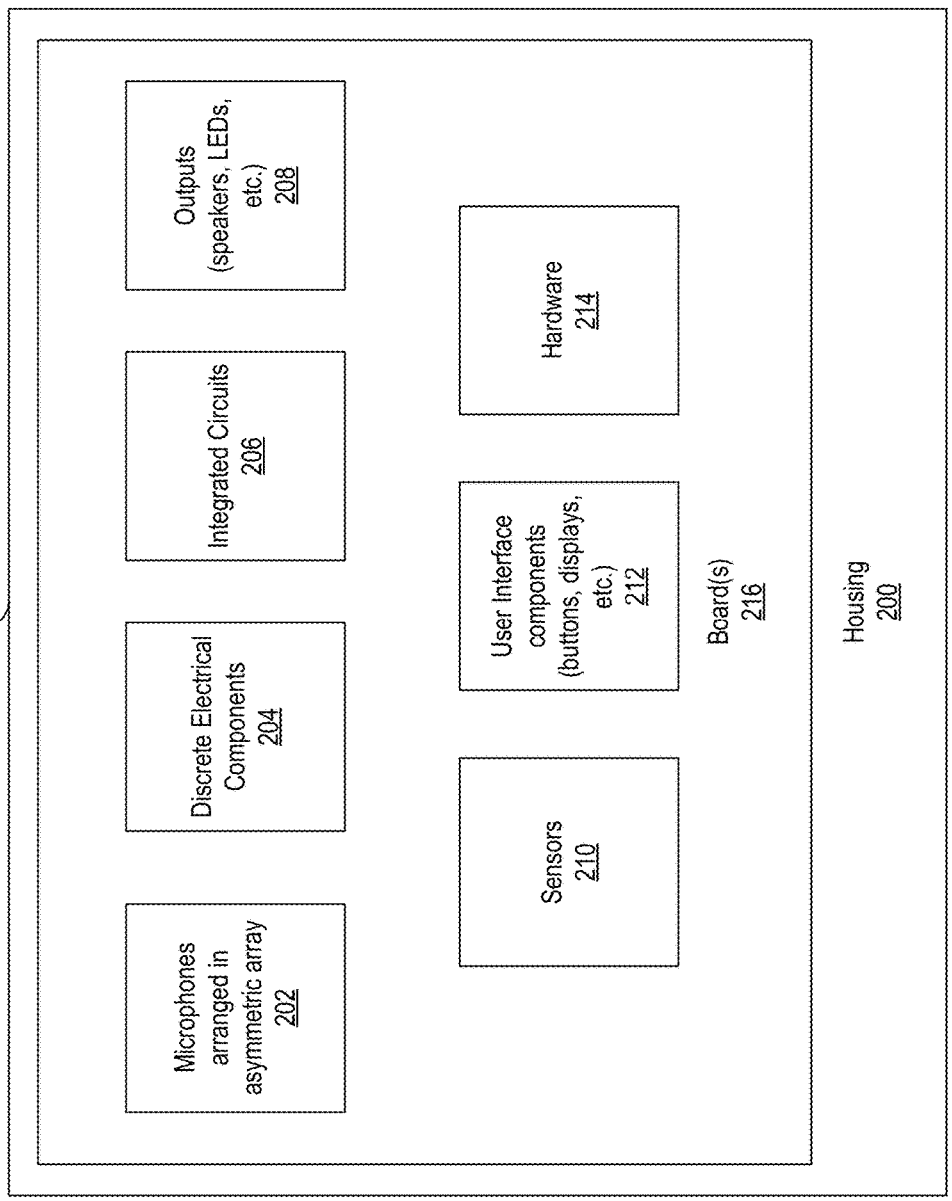
FIG. 2 is a block diagram showing a microphone system including an asymmetric array of microphones according to certain embodiments.

FIG. 2 shows a block diagram of an example of a microphone system 140 that can be used with the system 100 of FIG. 1 or with any of the systems described herein. The microphone system 140 includes a housing 200, a plurality of microphones 202 arranged in an asymmetric array, one or more discrete electrical components 204, one or more integrated circuits 206, one or more outputs 208, one or more sensors 210, one or more user interface components 212, and one or more mounting or other hardware components 214.

Some or all of the aforementioned components 202-214 can be mounted on one or more substrates or boards 216, which can be printed circuit boards (PCBs) for example. The boards 216 can be contained, enclosed, or otherwise supported by the housing 200, which can be a single-piece enclosure (e.g., a single-piece molded plastic), or a combination of pieces, such as a combination of molded plastic and perforated acoustic mesh to facilitate ingress and egress of incoming and outgoing sound. Depending on the embodiment, the microphone system 140 can be configured for placement or installation on or in a table-top, on or within a ceiling (e.g., to replace a ceiling panel), on or in a wall, or in some other desired location.

Examples of Asymmetric Microphone Systems

FIGS. 3A-3D depict views of a top board 216a (FIGS. 3A-3B) and a bottom board 216b (FIGS. 3C-3D) of one example of microphone system 140, where in an assembled configuration the top board 216a is stacked on the bottom board 216b, with the bottom of the top board 216a (FIG. 3B) facing the top of the bottom board 216b (FIG. 3C), and the stack is placed in a housing 200 (not shown in FIGS. 3A-3D). In the illustrated embodiment top board 216a and the bottom board 316b are printed circuit boards (PCB) each having a diameter D of 11 cm, although other sizes are possible.

Figure 3A:
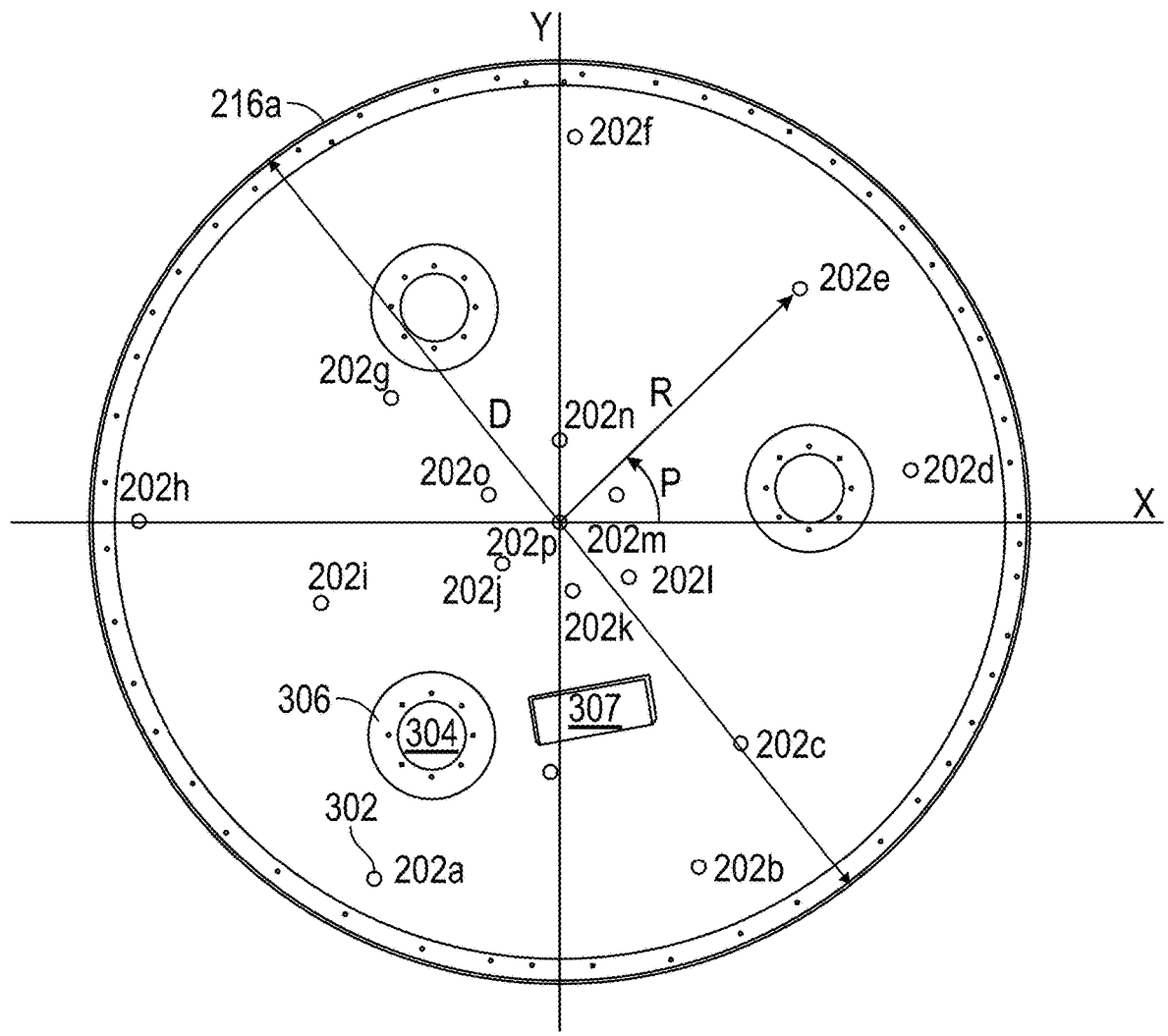
FIGS. 3A-3B illustrate top and bottom views of a top board of a two-board microphone system including an asymmetric array of microphones, according to certain embodiments.
Figure 3B:
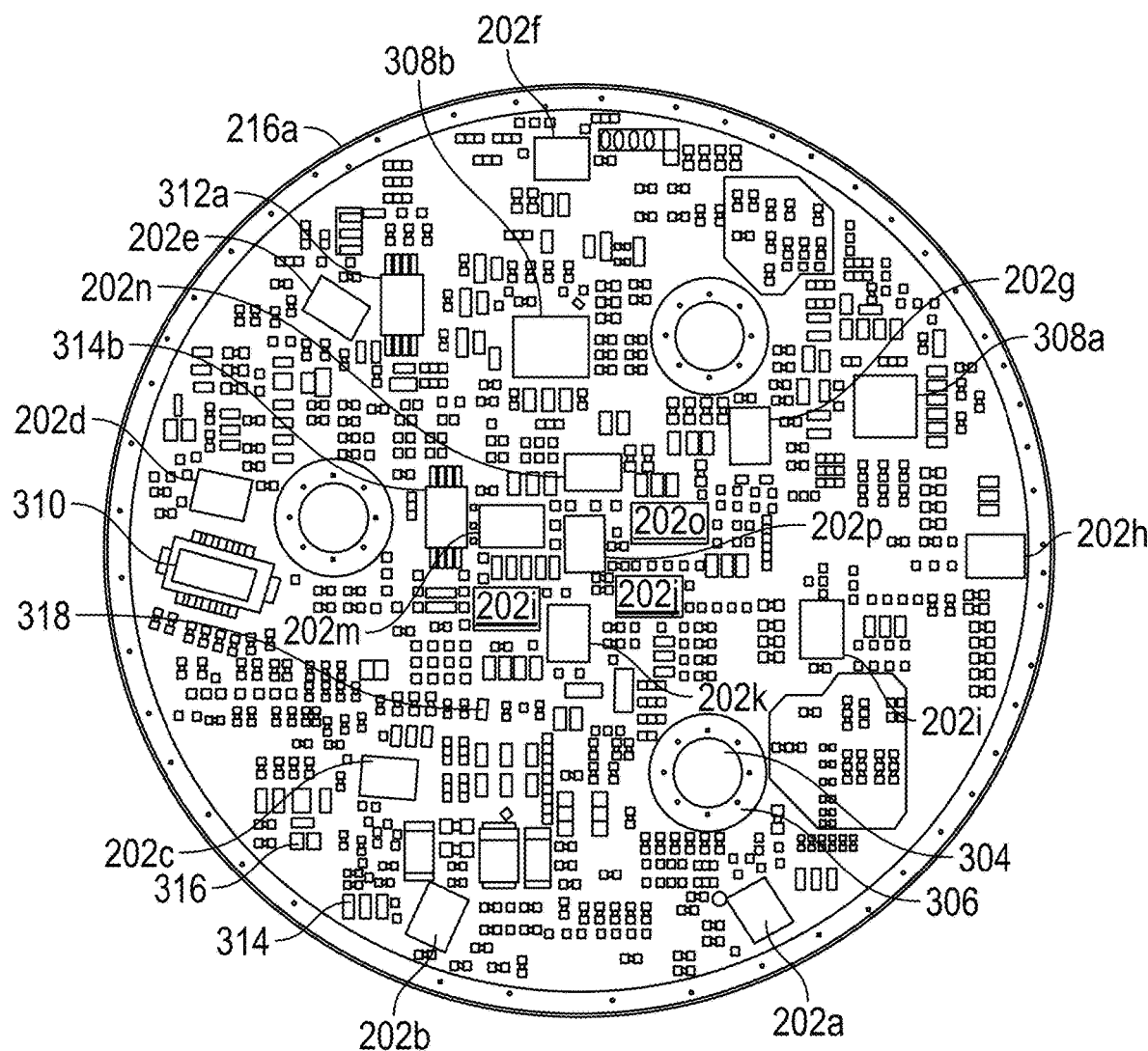

FIGS. 3A-3B respectively show top and bottom views of the top board 216a. Referring to FIG. 3B, a plurality of microphones 202a-202p are mounted to the bottom of the top board 216a. Referring to FIG. 3A, the top board 216a includes a plurality of circular holes 302 each corresponding to, and exposing a portion of the underside of, a corresponding one of the microphones 202a-202p. The holes 302 can facilitate detection of sound waves by the microphones 204a-204p incident on the microphone system 140 from the top of the top board 216a through the housing 200.

The microphones 202a-202p of the embodiment illustrated in FIGS. 3A-3D are each omnidirectional piezo electric MEMS-based acoustic microphone transducers capable of detecting sound in a frequency range of 10 Hz to 20,000 Hz and a high linearity frequency range of 80 Hz to 8,000 Hz, and are housed in integrated circuit packages mounted on the top board 216a. In other embodiments, other types of microphones can be used such as dynamic or condenser microphones.

The microphones 202a-202p of the illustrated embodiment include a first group of nine microphones 202a-202i and a second group of seven microphones 202j-202p. The processor 122 can process and/or combine signals output from the first group of microphones 202a-202i to generate sound content within a first frequency range, and process and/or combine signals output from the second group of microphones 202j-202p to generate output sound content within a second frequency range.

For example, the processor 122 may filter signals output by the first group of microphones 202a-202i using one or more first filters (e.g., bandpass filters), and combine the filtered outputs to generate processed audio within the first frequency range, and filter signals output by the second group of microphones 202j-202p using one or more second filters (e.g., bandpass filters), and combine the filtered outputs to generate processed audio within the second frequency range.

The second frequency range according to some embodiments is higher than the first frequency range, although the frequency ranges can overlap somewhat. In some embodiments, the maximum frequency of the first frequency range and the minimum value of the second frequency range are values at which the first group and the second group have similar noise performance. A variety of possible values are possible for the first and second frequency ranges. Here just a few examples:

| First Frequency Range (Hz) | Second Frequency Range (Hz) |
|---|---|
| 20-1,200 | 1,200-20,000 |
| 80-1,200 | 1,200-20,000 |
| 20-2,000 | 2,000-20,000 |
| 80-2,000 | 2,000-20,000 |
| 20-3,000 | 3,000-20,000 |
| 80-3,000 | 3,000-20,000 |
| 80-,1,200 | 1,200-8,000 |
| 80-2,000 | 2,000-8,000 |
| 80-3,000 | 3,000-8,000 |

While the examples provided indicate that the first and second frequency ranges overlap exactly at a single value (1,200, 2,000, or 3,000 Hz), in some embodiments the ranges can have larger overlaps, such as by 5, 10, 100, 1,000, 2,000, 3,000, 5,000 or more Hz, or by values between these amounts. Depending on the embodiment, the combined first and second frequency ranges can at least cover certain voice frequency bands, such as 300-3,400 Hz, 50-7,000 Hz, 50-14, 000 Hz, or 20-20,000 Hz. The frequency range can be relatively broad to capture not only speech bandwidths, but other sounds for improved noise handling or other purposes.

As shown in FIGS. 3A-3B, the microphones 202a-202o of the illustrated embodiment (excluding the central microphone 202p, which may not be included in some embodiments) are placed such that each microphone 202a-202o is at a unique radial distance R and different polar angle P from a center of the substrate as compared to the other microphones in the array. In the illustrated embodiment, the top board 216a has a diameter of 11 cm, and the microphones are positioned at the following unique radial distances R and polar angles P from the center of the substrate:

| Microphone | R(cm) | P(degrees) |
|---|---|---|
| 202a | 4.68 | 243.07 |
| 202b | 4.35 | 292.30 |
| 202c | 3.36 | 309.68 |
| 202d | 4.14 | 8.46 |
| 202e | 3.89 | 44.01 |
| 202f | 4.48 | 87.59 |
| 202g | 2.42 | 143.30 |
| 202h | 4.92 | 179.85 |
| 202i | 2.92 | 199.18 |
| 202j | 0.79 | 218.24 |
| 202k | 0.83 | 283.17 |
| 202l | 1.06 | 322.61 |
| 202m | 0.73 | 25.63 |
| 202n | 0.96 | 89.29 |
| 202o | 0.87 | 158.60 |
| 202p | 0.00 | 0.00 |

The radial distance R and polar angle are measured from the center of the board 216a to the center of the hole 302 (FIG. 3A) of the corresponding microphone 202, which also corresponds to the center of the package of each microphone 202 (FIG. 3B). In other implementations, rather than each microphone having a unique polar angle from all other microphones in the array, each microphone in a particular group has a unique polar angle as compared to the other microphones in that group, but may share a polar angle with one or more microphones in another group. In yet further implementations, one or more microphones in a group may share a common radial distance with other microphones in that group.

The sparse, scattered arrangement of the microphones 202a-202i in the first group can be helpful in accommodating additional componentry, particularly larger integrated circuits or other relatively large components. Variability in radial distances of microphones can help achieve this benefit.

For instance, in the illustrated embodiment, the radial distance of the innermost microphone 202g in the first group is about 49% (2.42/4.92) of the radial distance of the outermost microphone 202h in the first group, and about 44% (2.42/5.5) of the radius of the top board 216a. In various implementations, the radial distance of the innermost microphone 202g in the first group is no more than about 30, 35, 40, 45, 49, 50, 55, 60, or 70% of the radial distance of the outermost microphone 202h in the first group, and/or of the radius of the board 216.

Variability in polar angle of microphones in a group can also help achieve a sparse, scattered geometry to facilitate design flexibility. In a rigidly circular array, each microphone 202 in a group of nine microphones would be 40 degrees apart (360/9). In the illustrated embodiment, on the other hand, the maximum difference in polar angle between any two angularly adjacent microphones in the first group is between microphone 202f and microphone 202g, which are 55.71 degrees apart (about 139% [55.71/40] of the angular separation in a circular symmetric ring having the same number of microphones). In various implementations, the maximum difference in polar angle between any two angularly adjacent microphones in a group (e.g., an outer group, inner group, and/or a group of microphones for a particular frequency range) of N microphones is at least about 120, 130, 135, 140, 145, 150, 160, or 170% of 360/N.

The minimum difference in polar angle between any two angularly adjacent in the first group is between microphone 202b and microphone 202c, which are 17 degrees apart (about 43% [17/40] of the angular separation in a circular symmetric array). In various implementations, the minimum difference in polar angle between any two angularly adjacent microphones in a group (e.g., an outer or inner group excluding a central microphone) of N microphones is no more than about 25, 30, 40, 45, 50, 55, 60, or 65% of 360/N).

The combination of a relatively compact inner group of microphones 202j-202p and a sparse, scattered outer group 202a-202i can also help accommodate additional componentry. For instance, in the illustrated embodiment, the radial distance of the outermost microphone 202l in the relatively compact second group is 1.06 cm, or about 19% (1.06 cm/5.5 cm) of the radius of the top board 216a, and about 21% (1.06 cm/4.92 cm) of the radial distance of the outermost microphone 202h in the array. In various implementations, the radial distance of the outermost microphone 202l in the second group is no more than about 10, 15, 20, 25, 30, or 35% of the radius of the board 216a, or of the radial distance of the outermost microphone 202h in the array, thereby maintaining a compact geometry for the second group.

The wide variability in microphone radial distance between groups creates additional space for mounting components. For example, the radial distance of the innermost microphone 202m in the relatively compact second group is 0.73 cm, or about 13% (0.73 cm/5.5 cm) of the radius of the top board 216a, and about 15% (0.73 cm/4.92 cm) of the radial distance of the outermost microphone 202h in the outer group. In various implementations, the radial distance of the innermost microphone 202l in the second group is no more than about 5, 10, 15, 20, 25, or 30% of the radius of the board 216a, or of the radial distance of the outermost microphone 202h in the first group, thereby maintaining a compact geometry for the second group.

Referring now to FIG. 3B, the bottom side of the top board 216a accommodates the microphones 202a-202p as well as additional components. The additional components in the illustrated embodiment include: hardware 214 including three mounting holes 304 and corresponding periphery regions 306 configured to accept three PCB standoffs 340a-340c of the bottom board 216b (FIG. 3B); integrated circuits 206 including i) a pulse density modulation to pulse code modulation to time domain multiplexed (PDM to PCM to TDM) converter and channel aggregator 308a for format converting and aggregating audio signals output by the outer group of microphones 202a-202i, ii) a second PDM to PCM to TDM converter and channel aggregator 308b for format converting and aggregating signals output by the inner group of microphones 202j-202p, iii) a first clock distribution integrated circuit 312a for sending clock signals to the first group of microphones 202a-202i, and iv) a second clock distribution integrated circuit 312b for sending clock signals to the second group of microphones 202j-202p; additional hardware 214 including a male board to board connector 310 for electrically connecting the bottom board 216a and the top board 216b (e.g., for routing PDM to PCM to TDM converted microphone signals to the bottom board 216b); and a number of discrete electrical components including surface mount devices (SMDs) comprising inductors 314, capacitors 316, and resistors 318; and a proximity sensor 307, which can an optical sensor or other type of sensor be used to detect a user's hand over the microphone for temporary muting or other control purposes.

Figure 3C:
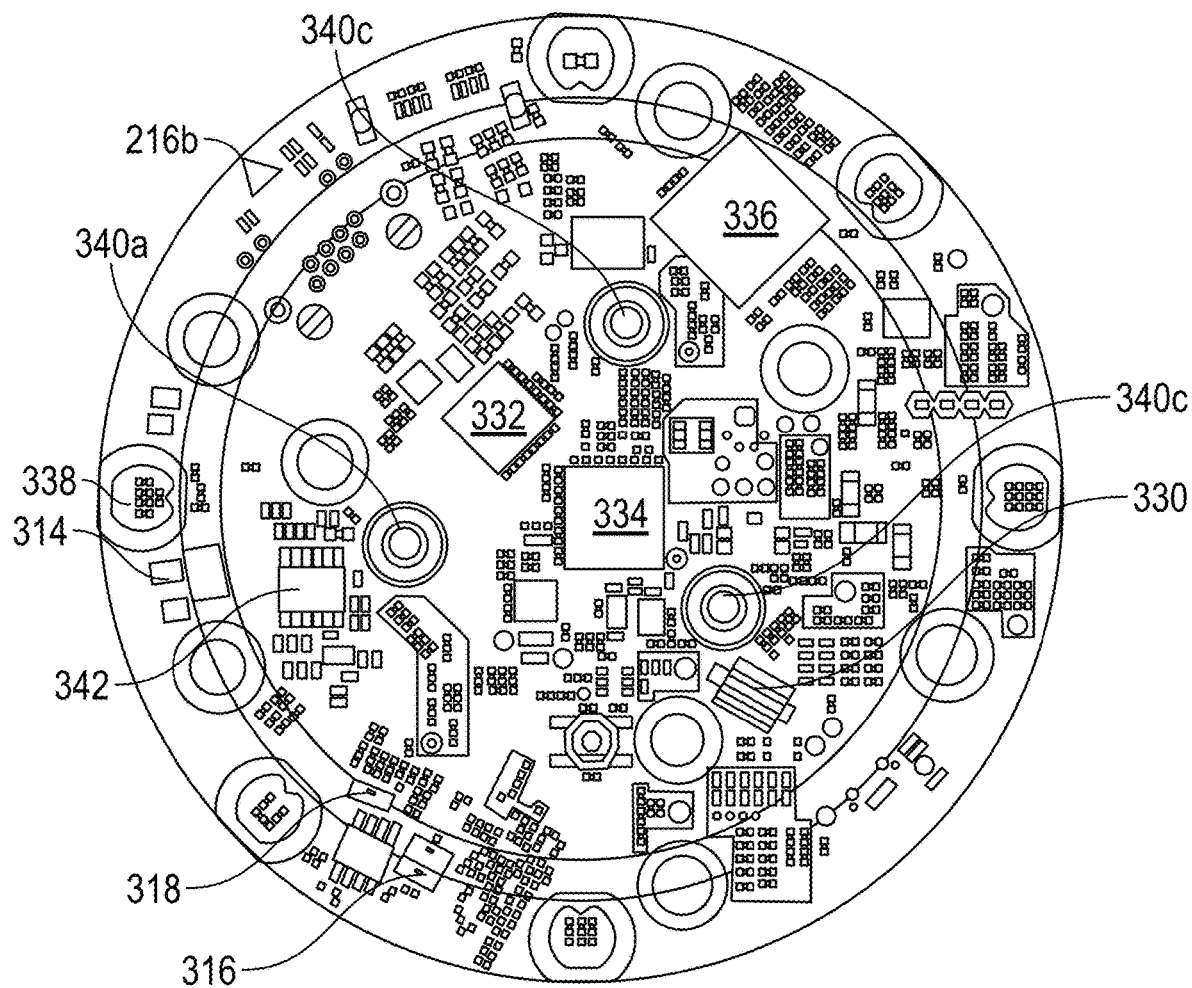
FIGS. 3C-3D illustrate top and bottom views of a bottom board configured to mate with the top board of FIGS. 3A-3B.

FIG. 3C illustrates a top view of the bottom board 316a. Mounted on the top board 316a of the illustrated embodiment are: hardware 214 including a female board-to-board connector 330 for connecting with the male connector 310 of the top board 216a, and the PCB standoffs 340a-340c for spacing the two boards 216a, 216b when assembled; integrated circuits 206 including an SDRAM memory device 332, a microprocessor 334, an Ethernet switch 336, and a power over Ethernet (POE) power controller 342; user interface components including six LEDs 338 arranged around the periphery of the board 216b to form a light ring; and discrete electrical components 204 including SMD inductors 314, capacitors 316, and resistors 318.

Figure 3D:
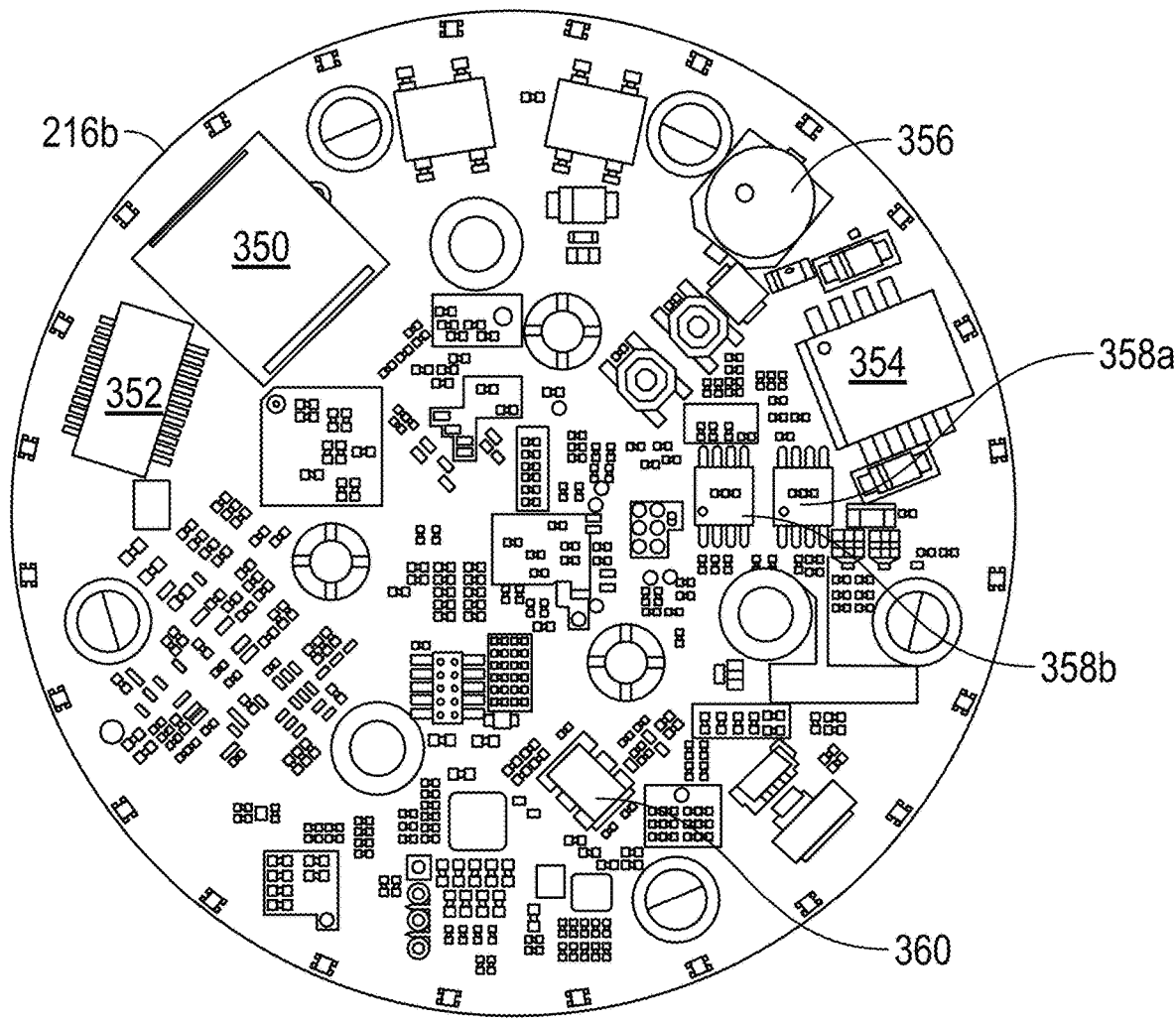

Referring to FIG. 3D, following components are mounted to the bottom of the bottom board 216 of the illustrated embodiment: hardware 214 including an Ethernet jack 350 for connecting to a network 130 and Ethernet magnetics 352 for isolating the Ethernet connection/componentry; discrete electrical components power supply transformer 354, electrolytic capacitor 356, MOSFET transistors 358a-b; and integrated circuits 206 including the voltage controlled oscillator 360. During operation, the microprocessor 334 can package detected audio signals to the Ethernet switch 336a according to the Ethernet protocol for delivery to the network 130 over the Ethernet jack 350.

In addition to providing improved flexibility for mounting components, asymmetric arrays can provide performance benefits. For example, having variable distances between the microphones in the array and reflective surfaces such as the outer case can prevent constructive interference, effectively spreading out and cancelling certain types of noise as compared to symmetric designs.

Figure 4:
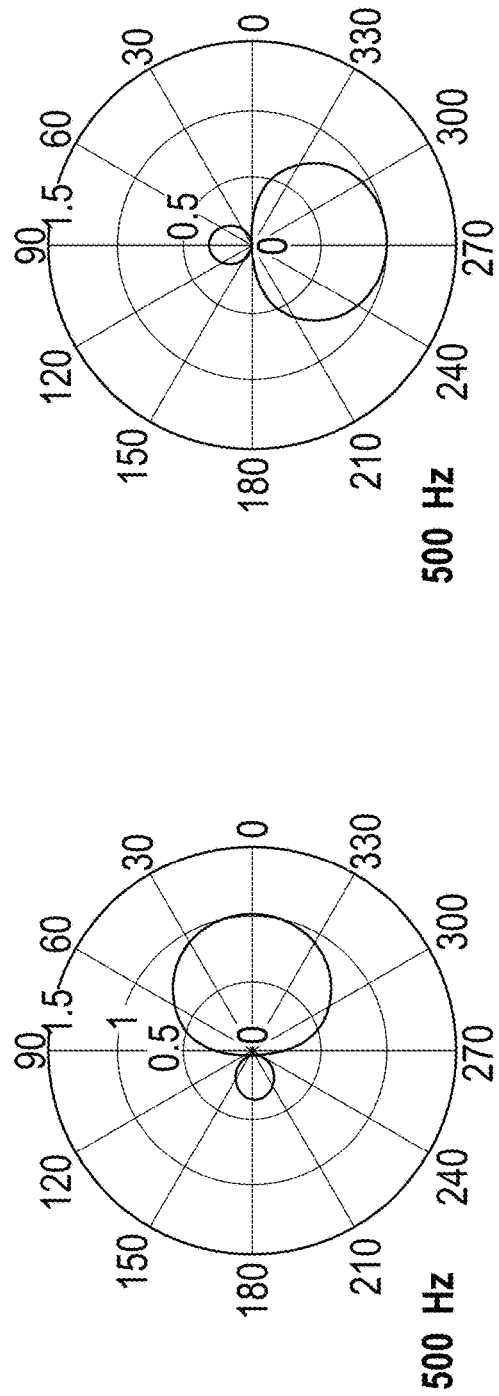
FIG. 4 illustrates directional performance of the microphone system of FIGS. 3A-3D at 0, 90, 180, and 270 degrees.
Figure 4:
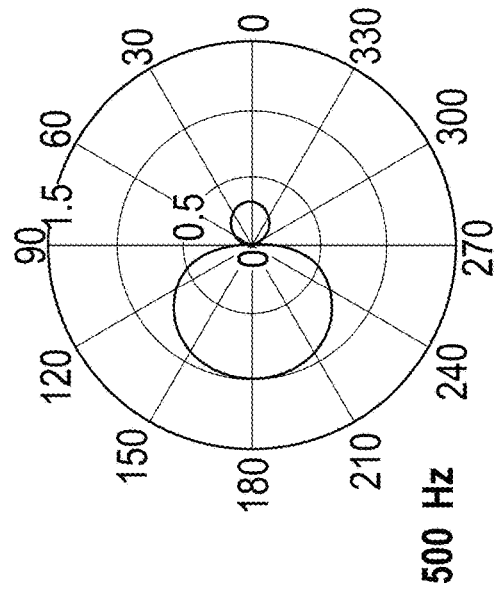
Figure 4:
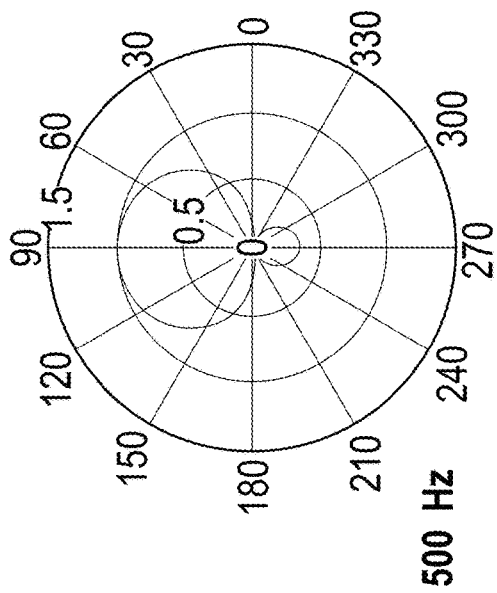

The plots shown in FIG. 4 illustrate performance of the microphone array 40 of FIGS. 3A-3D. As shown, the microphone system 140 of FIGS. 3A-3D, after beamforming and other appropriate processing by the processor 122, achieves good directionality in detecting 500 Hz sound at 0/360 degrees (upper left quadrant), 90 degrees (lower left quadrant), 180 degrees (lower right quadrant), and 270 degrees (upper right quadrant), while maintaining a flexible, asymmetric microphone placement geometry. Because the cross-over frequency between the first and second groups of microphones 202a-i, 202j-p is about 1200 Hz, the plots primarily show performance of the first group 202a-202i, which is used to detect sounds in a frequency range of about 20-1,200 Hz.

Single Board Embodiment Microphone System

While the embodiment of FIGS. 3A-3D is a dual-board configuration, in some cases it can be desirable to have a single board implementation, where the microphones and additional componentry in the microphone system 140 is accommodated on a single board. This can be advantageous from a visual design stand-point because it allows a slim, sleek aesthetic, or for functional reasons by allowing the microphone system to fit into thinner, flatter form factors, such as for use in a ceiling tile or other space.

Figure 5:
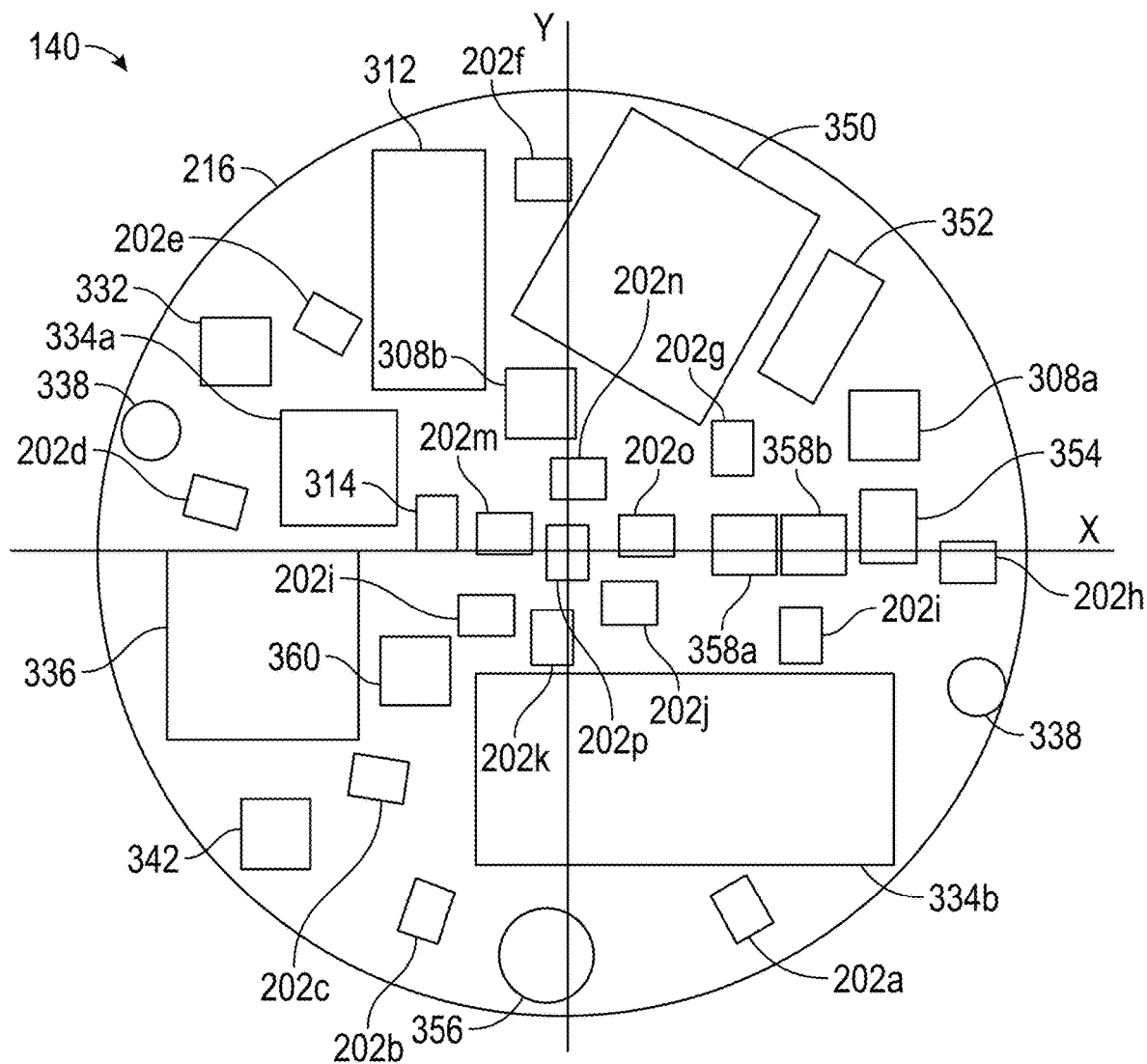
FIG. 5 illustrates a single-board microphone system including an asymmetric array of microphones according to additional embodiments.

The design flexibility provided by the asymmetric microphone arrangements disclosed herein can be useful in enabling single-board implementations. FIG. 5 shows one example of a single board microphone system 140. Mounted on the microphone board 216 are microphones 202a-202p arranged in a substantially similar arrangement to that of the embodiment of FIGS. 3A-3D, although different arrangements are possible. In addition, a large number of other components 308-360 are mounted on the board 216. The components 308-360 can be the same as the like-numbered components in FIGS. 3A-3D, although the system 140 of FIG. 5 includes a second microprocessor 334b.

As shown, the second microprocessor 334b has a rather large footprint, illustrating how the asymmetric microphone arrangement can physically accommodate components that a rigid symmetric array, such as an array of concentric rings, could not. In one embodiment, one or both of the microprocessors 334a, 334b implement on-board fixed or adaptive acoustic echo cancellation, on-board fixed or adaptive beamforming, or both. Where echo cancellation and/or beamforming are performed on-board the microphone system 140 itself, one or both of the operations may be performed in the frequency domain, and the microprocessors 334a, 334b are programmed to perform time to frequency conversion and frequency to time conversion to convert the signals into the frequency domain for fixed or adaptive echo cancelation and/or fixed or adaptive beamforming, and back to the time domain for further processing. In other implementations, one of echo cancelation or beamforming is performed on-board in the frequency domain and the other is performed on-board in the time domain, and in yet further embodiments both are performed on-board in the time domain.

The combination of the compact second group of microphones 202j-202p and the relatively sparse first group 202a-202i allows for flexible placement of non-microphone components, including relatively large components like the second processor 334b and the Ethernet jack 350. As shown, the radial distance of a number of the components (measured from the center of the board 216 to the center of the respective component package) is greater than the radial distance of the microphone in the second group 202j-202p nearest to the component and less than the radial distance of the microphone in the first group 202a-202i nearest to the component (where "nearest" means the microphone having its center nearest to the center of the component package). As a few non-exhaustive examples: i) the radial distance of the microprocessor 334a is greater than the radial distance of microphone 202m and less than the radial distance of the microphone 202d; ii) the radial distance of the power supply transformer 354 is greater than the radial distance of the microphone 202o and less than the radial distance of the microphone 202h; and iii) the radial distance of the voltage controlled oscillator 360 is greater than the radial distance of the microphone 202l and less than the radial distance of the microphone 202c.

The relatively wide variability in radial distance between certain microphones in the outer group of microphones 202a-202i provides additional flexibility. For example, the components 358b and 354 are positioned in the space between the two microphones 202g, 202h in the outer group that have the largest difference in radial distance. Moreover, the relatively wide variability in angular separation between certain microphones in the outer group of microphones 202a-202i provides flexibility, evidenced by the placement of the relatively large Ethernet jack 350 between the microphones 202f, 202g having the largest angular separation of any two angularly adjacent microphones in the outer group 202a-202i.

While certain embodiments have been shown for the purposes of illustration, other implementations are possible. For example, while the microphone boards 216 of the illustrated embodiments are circular, other shapes (rectangle, square, triangle, ovals, etc.) are possible in implementations. Moreover, while a particular arrangement of microphones has been shown, other arrangements are possible. For example, alternative implementations include arrangements in which the microphones within one or both the groups are placed at different locations, arrangements where there are more than two groups of microphones (e.g., three, four, five, or more groups), and/or arrangements where there are different numbers of microphones overall or within the groups. Moreover, there can be other numbers of microphones in other embodiments, including 4, 8, 20, 24, 32, 36, 48 or more microphones. For instance, where acoustic echo cancellation is performed on the microphone system 140 itself, 20, 32, 48 or more microphones can be included.

Microphone Array Construction

Figure 6:
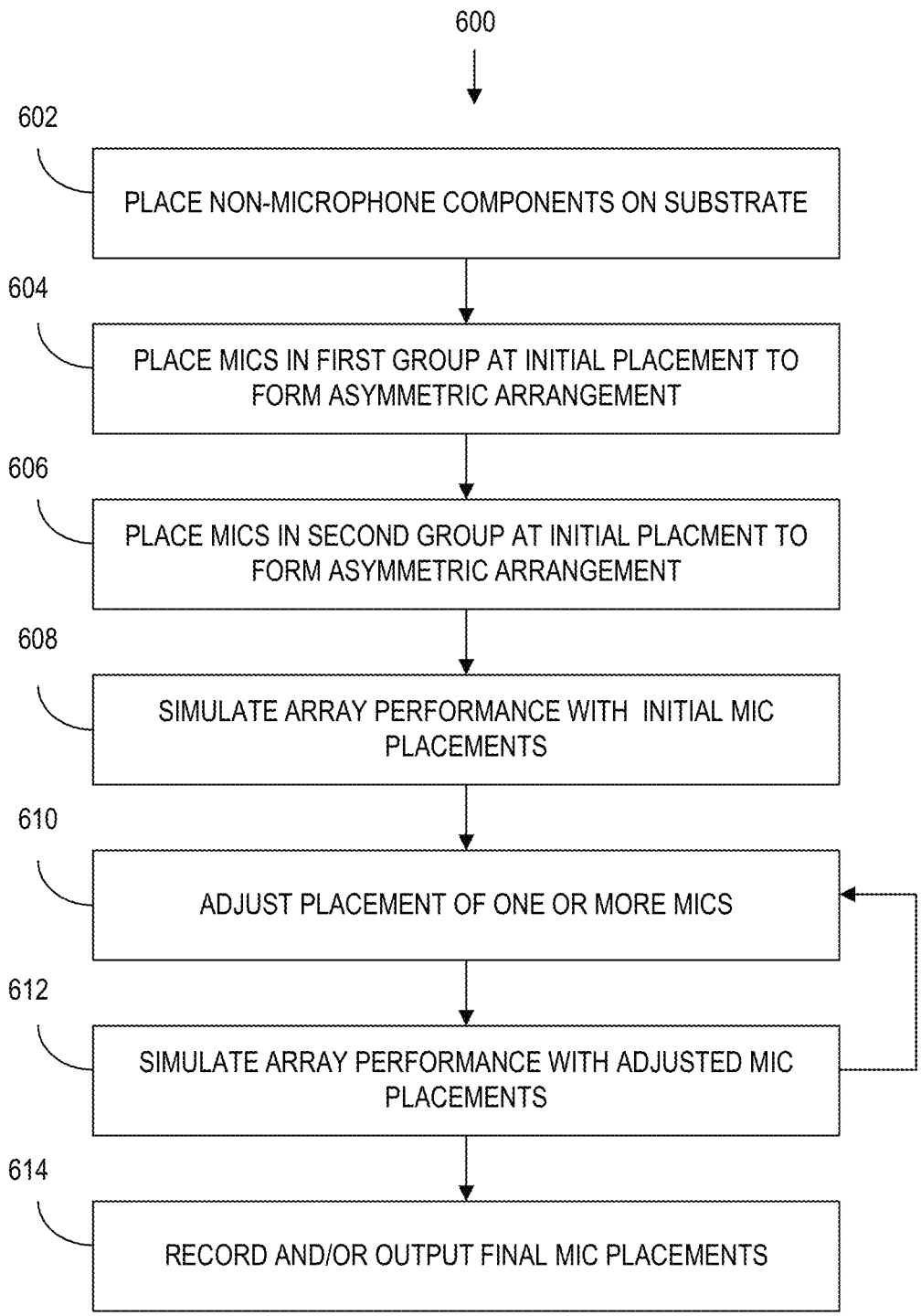
FIG. 6 illustrates a method of placing microphones in a microphone array according to certain embodiments.

FIG. 6 is a flowchart showing an example of a method 600 of placing microphones asymmetrically in an array.

At step 602, any non-microphone components are placed on the substrate. For example, a user can use a computer-aided design (CAD) software tool to place one or more integrated circuits, discrete electrical components, sensors, user interface components, physical hardware, or generally any of the additional components shown and/or described herein, e.g., with respect to FIGS. 2, 3A-3D, and 5.

At step 604, each microphone in a first group of microphones (e.g., the microphones 202a-202i) are placed in an initial asymmetric arrangement in which each of the microphones has a unique polar angle and radius with respect to the center of a substrate. The placements may be selected by a user in a software design and/or simulation tool, or be automatically selected by a computer (e.g., using an algorithm involving a pseudorandom number generator).

Whether manual or by computer, the placements can in some embodiments be arbitrarily selected but within certain constraints. For example, radius may be selected from a set of available radiuses between a certain minimum radius and a certain maximum radius. Moreover, the microphones cannot be placed where one of the additional non-microphone components were placed in step 602. A further constraint may require that the radiuses and/or the polar angles satisfy some distribution profile within the range of possible values (e.g., at least some percentage of the microphones in the first group between each of 0 and 90, 90 and 180, 180 and 270, and 270 and 360 degrees).

At step 606, each microphone in a second group of microphones (e.g., the microphones 202j-202n) are placed in an initial asymmetric arrangement in which each of the microphones has a unique polar angle and radius with respect to the center of a substrate. The placement can be made in substantially the same fashion as for the first group, but with different constraints (e.g., smaller minimum radius and smaller maximum radiuses to select from).

At step 608, microphone performance is simulated at the initial placements. For example, the user may place the microphones using a software design tool, export the initial microphone placements to a software simulation tool, and simulate beamforming or other performance metrics at the initial microphone placements using the simulation tool.

At step 610, one or more of the microphones in the first and/or second group can be moved to an adjusted location. For example, a user may review performance a particular frequency range, and based on the review, adjust the placement of one or more of the microphones in the design tool to a location on the substrate that should provide improved performance in that frequency range.

At step 612, microphone performance is again simulated and reviewed to determine whether sufficient array performance has been achieved. Steps 610 and 612 can be iterated to adjust placement of the microphones until sufficient array performance is observed.

In alternative embodiments, placement of the non-microphone components at step 602 can be performed after placement of the microphones (after steps 604-612). Where step 602 is performed after placement of the microphones, if there is not an adequate empty space on the substrate to place an additional component (e.g., a relatively large IC) after placement of the microphones, steps 610-612 may need to be iterated to move one or more of the microphones and free up space for the additional component.

Moreover, where step 602 is performed before placement of the microphones, it could be the case that no placement of the microphones can be found that provides sufficient array performance. In this circumstance, the initial placement of one more of the additional components can be adjusted before moving the microphones further to find a microphone placement that provides sufficient performance.

Once final microphone placements are found, the final placements are recorded and/or output at step 614, e.g., by the software design tool. The microphone system can then be fabricated using the output, by physically mounting the microphones on the PCB(s) according to the output obtained at step 614.

Terminology/Additional Embodiments

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the disclosures described herein can be embodied within a form that does not provide all of the features and benefits set forth herein, as some features can be used or practiced separately from others. The scope of certain disclosures disclosed herein is indicated by the appended claims rather than by the foregoing description. All changes which come within the meaning and range of equivalency of the claims are to be embraced within their scope.

What is claimed is:

1. An acoustic microphone array system, comprising:
   a single substrate; and
   an array of acoustic microphones including a first group of acoustic microphones placed on the single substrate in an asymmetric pattern and a second group of acoustic microphones, wherein the radial distance of each microphone in the first group of microphones is larger than the radial distance of each microphone in the second group of microphones,
   wherein the first group of microphones includes N microphones, and the maximum difference in polar angle between any two angularly adjacent microphones of the first group of microphones is at least 130% of 360/N.

2. The system of claim 1 wherein the second group of microphones is placed on the single substrate in an asymmetric pattern.

3. The system of claim 1 wherein a radial distance of an innermost microphone in the second group of microphones is no more than about 25% of a radial distance of an outermost microphone in the first group of microphones.

4. The system of claim 3 further comprising one or more packaged integrated circuits placed on the single substrate at a radial distance greater than the radial distance of the innermost microphone in the second group and less than the radial distance of the outermost microphone in the first group.

5. The system of claim 1 wherein the radial distance of an innermost microphone in the first group of microphones is no more than 50% of the radial distance of an outermost microphone in the first group of microphones.

6. The system of claim 5 further comprising one or more packaged integrated circuits placed on the single substrate at a radial distance between the radial distance of the innermost microphone in the first group of microphones and the radial distance of the outermost microphone in the first group of microphones.

7. The system of claim 1 further comprising a packaged integrated circuit placed between angularly adjacent microphones in the first group of microphones.

8. The system of claim 1 further comprising a group of packaged integrated circuits mounted on the single substrate together with the first and second groups of microphones, the group of packaged integrated circuits comprising one or more networking devices and one or more microprocessors.

9. The system of claim 1 further comprising a processor placed on the single substrate and configured to perform acoustic echo cancelation on signals output by the first and second groups of microphones.

10. The system of claim 1 further comprising a processor configured to combine signals output by the first group of acoustic microphones to generate output sound within a first frequency range and to combine signals output by the second group of acoustic microphones to generate output sound within a second frequency range.

11. The system of claim 10 wherein the first and second frequency cover a combined frequency that at least includes frequencies from 1,000 Hz to 14,000 Hz.

12. The system of claim 11 wherein a maximum frequency in the first frequency range is substantially less than 14,000 Hz, and a minimum frequency of the second frequency range is substantially more than 1,000 Hz.

13. The system of claim 10 wherein the processor is remote from the first and second groups of microphones, and in communication with the first and second groups of microphones via a network.

14. The system of claim 1, further comprising a plurality of non-microphone components placed on the single substrate.

15. An audio system, comprising:
    a single substrate;
    an array of acoustic microphones including a first group of acoustic microphones arranged on the single substrate in an asymmetric pattern and a second group of acoustic microphones arranged on the substrate in an asymmetric pattern, wherein the radial distance of an innermost microphone of the first group of microphones from a center of the single substrate is greater than a radial distance of an outermost microphone of the second group of microphones and no more than about 40% of the radial distance of an outermost microphone of the first group of microphones, and the radial distance of the outermost microphone in the second group of microphones is no more than about 25% of the radial distance of the outermost microphone in the first group of microphones; and
    a processor configured to combine signals output by the first group of acoustic microphones to generate output sound within a first frequency range and to combine signals output by the second group of acoustic microphones to generate output sound within a second frequency range, wherein the first group of microphones includes N microphones, and the maximum difference in polar angle between any two angularly adjacent microphones of the first group of microphones is at least 130% of 360/N.

16. The system of claim 15 wherein the processor is remote from the first and second groups of microphones, and in communication with the first and second groups of microphones via a network.

17. A method of generating a microphone layout for an array microphone, comprising:
    placing each microphone in first and second groups of microphones in an initial position on a single substrate, wherein subsequent to said placing each microphone, the microphones are arranged at an initial set of microphone positions, wherein the first group of microphones includes N microphones, and the maximum difference in polar angle between any two angularly adjacent microphones of the first group of microphones is at least 130% of 360/N;
    with a software simulator, determining array performance with the microphones at the initial set of microphone positions;
    subsequent to said determining array performance, adjusting placement of one or more microphones in one or both of the first group of microphones and the second group of microphones such that the microphones are arranged at an adjusted set of microphone positions;
    with the software simulator, determining adjusted array performance at the adjusted set of microphone positions;

repeating said adjusting placement and determining adjusted array performance said adjusted array performance indicates sufficient performance at a set of final microphone positions in which the first group of microphones is arranged in a first asymmetric pattern and the second group of microphones is arranged in a second asymmetric pattern; and placing a plurality of non-microphone components on the single substrate.

18. The method of claim 17 wherein at the set of final microphone positions, each microphone in the first group is located at a longer radial distance from the center of the substrate than each microphone in the second group.

19. The method of claim 17 wherein said placing the plurality of non-microphone components is performed prior to said placing each microphone in the first and second groups of microphones in an initial position on the single substrate.

* * * * *